United States Patent [19]

Arnold

[11] Patent Number: 5,783,476
[45] Date of Patent: Jul. 21, 1998

[54] INTEGRATED CIRCUIT DEVICES INCLUDING SHALLOW TRENCH ISOLATION

[75] Inventor: Norbert Arnold, New Hempstead, N.Y.

[73] Assignee: Siemens Aktiengesellschaft, Munich, Germany

[21] Appl. No.: 883,356

[22] Filed: Jun. 26, 1997

[51] Int. Cl.⁶ .................................................. H01L 21/76
[52] U.S. Cl. .......................... 438/425; 438/424; 438/426; 438/444; 438/440
[58] Field of Search ........................... 438/425, 426, 438/444, 424, 440

[56] References Cited

U.S. PATENT DOCUMENTS

| | | | |
|---|---|---|---|
| 4,842,675 | 6/1989 | Chapman et al. | 438/427 |
| 5,445,989 | 8/1995 | Lur et al. | 438/427 |
| 5,565,376 | 10/1996 | Lur et al. | 438/437 |
| 5,686,344 | 11/1997 | Lee | 438/425 |

*Primary Examiner*—Trung Dang
*Attorney, Agent, or Firm*—Stanton C. Braden

[57] ABSTRACT

A process for forming a silicon oxide-filled shallow trench on the active surface of a silicon chip starts with forming a trench in the silicon chip that has an upper portion with vertical side walls and a lower portion with tapered side walls. Then oxygen is implanted selectively into the walls of the lower portion of the trench and the chip is heated to react the implanted oxygen with the silicon to form silicon oxide. The rest of the trench is then filled with deposited silicon oxide, typically by depositing a layer of silicon oxide over the surface and then planarizing the deposited silicon oxide essentially to the level of the top of the trench. The silicon-filled shallow trench serves to divide the surface portion of the chip into discrete regions, each for housing one or more circuit components of an integrated circuit.

1 Claim, 2 Drawing Sheets

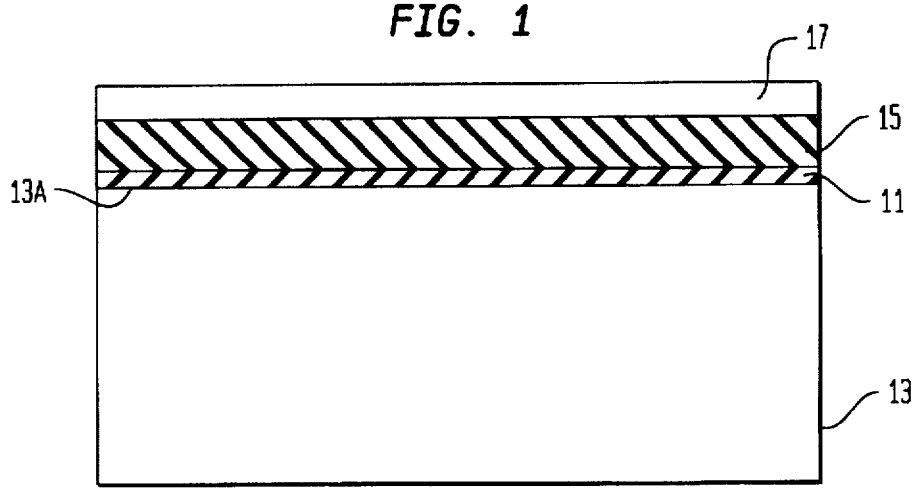
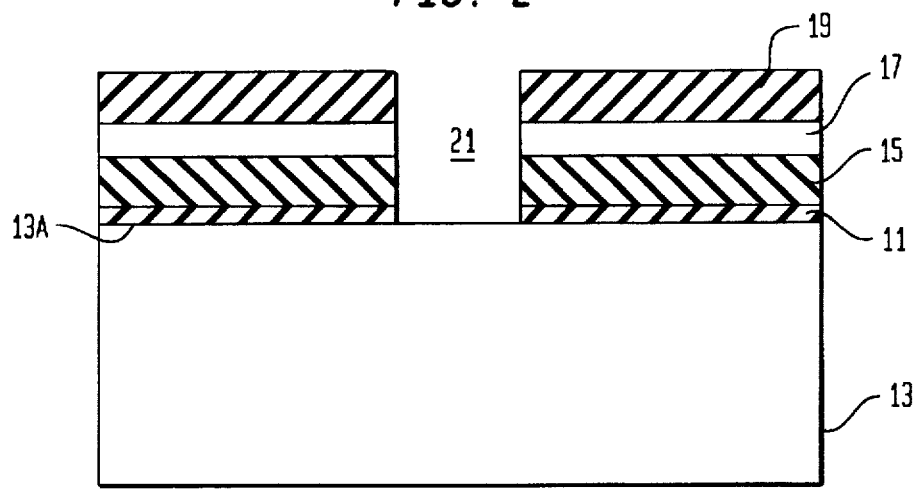
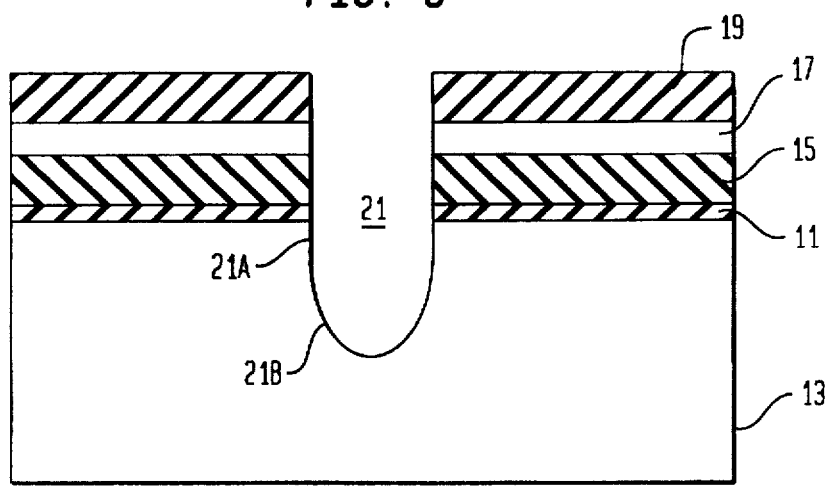

INTEGRATED CIRCUIT DEVICES INCLUDING SHALLOW TRENCH ISOLATION

FIELD OF THE INVENTION

This invention relates to integrated circuit devices, and more particularly, to such devices that includes shallow trenches filled with a dielectric to isolate into discrete portions the silicon chip in which the integrated circuit is imbedded.

BACKGROUND OF THE INVENTION

For an integrated circuit that is imbedded in a silicon chip, it is usually necessary to divide the active surface portion of the chip into discrete portions electrically isolated from one another. Then one or more different components of the circuit, such as transistors, capacitors, resistors and/or diodes, are formed in the different discrete portions and then electrically connected together by conductors on said active surface in accordance with the desired circuit design. Because the active surface area of the chip needs to be utilized efficiently in high density integrated circuits, it becomes important to isolate the discrete portions from one another in a manner that uses as little such surface area as feasible. A technique for such isolation that is becoming of increasing importance is one described as shallow trench isolation (STI). In this technique the isolation is provided by narrow dielectric-filled trenches that are formed on the active surface of the chip. These trenches typically are desirably deeper than they are wide, with the width often less than a micron. Trenches of this size pose difficulties in being filled completely reliably. The filling typically is done by depositing silicon oxide over the entire trenched surface of the chip and then using chemical mechanical polishing (CMP) to planarize the surface to remove the silicon oxide except where it filled the trenches. However, with trenches of the small sizes typically desired, it is difficult to achieve a desired degree of filling consistently over the whole chip.

SUMMARY OF THE INVENTION

In accordance with the present invention the isolation trenches to be filled advantageously are formed in two steps. First, there is formed by etching a trench in an upper or surface portion of the chip, advantageously of a depth that approximately matches the width of the trench and with side walls that are essentially vertical. Second, the trench is deepened by adding a lower portion whose width is gradually tapered with depth such that at the bottom of the trench the width is narrower than at the surface. This makes filling much easier, since the sharp corners at the bottom of the trench have been essentially eliminated. Advantageously this tapered portion should extend between one quarter and three quarters of the uniform-width upper portion of the trench. After deposition of a silicon nitride protection cap the top surface of the chip is bombarded perpendicularly with oxygen ions to implant the oxygen ions in the chip, selectively in the regions adjacent the lower tapered portion of the trench. Subsequently the chip is heated both to diffuse the oxygen ions into the chip deeper at the bottom portion of the trench and wider at the tapered side wall portions of the trench. The portions of the chip where the oxygen diffuses into the silicon effectively become of higher resistivity either because they become oxidized or simply because the presence of oxygen increases the resistivity. Moreover, where the silicon is oxidized, there is the usual volume change that tends to fill the bottom portion of the original trench with silicon oxide. The remainder of the trench can be filled with silicon oxide in the usual fashion. Typically this involves covering the top surface with silicon oxide and then planarizing by CMP, leaving the trenches filled with oxide.

From one view point, the present invention is directed to a process for forming a trench filled with silicon oxide in a silicon chip. The process comprises the steps of forming in the silicon chip a trench that has at least a lower portion that has tapered side walls; implanting oxygen ions in the walls of said lower portion of the trench; heating the chip to form silicon oxide of the oxygen-implanted lower portion of the trench; and filling the remaining portion of the trench with deposited silicon oxide.

The invention will better understood in the light of the following more detailed description taken in conjunction with the accompanying drawings.

BRIEF DESCRIPTION OF THE DRAWINGS

FIGS. 1–6 show cross-sections of a silicon chip at various stages in the process of forming silicon-oxide filled trenches therein in accordance with the invention.

Figure 4:
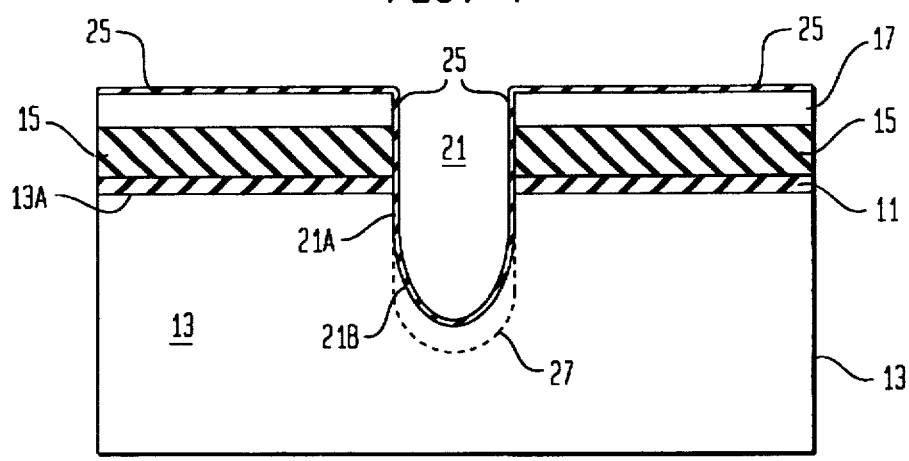

It should be noted that the figures are not necessarily to scale.

DETAILED DESCRIPTION

The invention relates to semiconductor device fabrication. In particular, the invention relates to forming shallow trench isolations for separating components within the device. Typically, as is now the general practice in the industry, devices are processed in parallel in or on a semiconductor wafer that subsequently would be diced into individual chips comprising a device. For purposes of simplification, the processing will be described in terms of a single chip.

As described above, the device is formed in and/or on a semiconductor wafer. The wafer, for example, comprises monocrystalline silicon. Other types of semiconductor wafers, such as silicon on insulator (SOI) or gallium arsenide, are also useful.

As shown in FIG. 1, a thin layer of a sacrificial oxide 11 (PAD oxide) is typically formed over an active (top) surface 13A of a chip or substrate 13 comprising, for example, silicon. This oxide serves primarily to protect the silicon surface during the processing. Then there is formed over the PAD oxide 11 a layer of silicon nitride 15 (PAD nitride) that serves as an etch stop in the processing. Next there is deposited over the top surface a layer 17 of a material that serves as a barrier to the oxygen bombardment that will eventually be used to implant oxygen selectively into the trenches to be formed. Polycrystalline silicon is especially well suited for this purpose. Other materials which prevent penetration of oxygen ions, such amorphous silicon or germanium, are also useful. The thickness of the layer 17 advantageously should be such that it can effectively be oxidized completely in the heating that is used to anneal the implanted oxygen later in the processing.

Next, as seen in FIG. 2, by usual lithographic techniques, a mask layer 19 comprising of, for example, resist is formed and patterned, defining a trench to be etched. Then advantageously the polycrystalline layer 17, the silicon nitride 15, and the PAD silicon oxide 11 are etched away selectively in the region where the trench is to be formed, there exposing the bare silicon surface 13A. Typically such etching would be done by reactive ion etching (RIE) that is capable of etching anisotropically. The resist layer 19 is removed after etching.

Now with reference to FIG. 3, after the chip surface 13A has been bared where the trench is to be formed, the substrate 13 is etched anisotropically in known fashion to form therein a trench 21 having an upper portion 21A with essentially vertical sidewalls. The height of this portion 21A is advantageously about the same as the width of the trench, which typically might be of the order of the minimum feature size, currently about 0.175 micron. However, in some instances a shallower depth, e.g., one half the width of the trench, could be adequate. Any of the known reactive ion etching (RIE) techniques known for etching trenches with essentially vertical side walls can be used for this purpose.

Next, there is etched a lower tapered portion 21B of the trench 21. The combined depth of portions 21A and 21B is sufficient to serve as a shallow trench isolation. Typically, the height of portion 21B advantageously is between about one quarter and three quarters of the width of the trench 21. Any of the RIE techniques known for etching trenches with tapered side walls can be used for this step.

Next, as seen in FIG. 4, after removal of the mask 19 that had been used to define the trench area for etching, there is advantageously deposited a thin layer of silicon nitride 25 over of the substrate 13. The nitride serves as a screen layer for the subsequent oxygen ion implant. Other material that serves as a screen implant layer which is selective to oxide is also useful. Additionally a combination of oxide and nitride layers is also useful. After the silicon nitride layer 25 is in place, the silicon chip 13 is bombarded with oxygen ions for implantation. Because of the masking effect of layer 17, the oxygen is implanted selectively primarily in the tapered side wall and bottom wall of the trench portion 21B. The oxygen implantation is done advantageously, for example, as described in a paper entitled "SIMOX-a new challenge for ion implantation" by A. Auberton et al., published in Nuclear Instruments and Methods in Physics Research B96 (1995) pp 420–424, which is herein incorporated by reference for all purposes. For example dosages of between about $4 \times 10^{18}$ O+/cm2 and $1 \times 10^{18}$ O+/cm2 with energies of about 120 KeV are described as satisfactory. In FIG. 4 the extent of penetration of the oxygen into the walls of the trench is indicated by the broken line 27. The oxygen will also be implanted in the polycrystalline layer 17 that served as a mask and this will also be converted to silicon oxide. The oxygen so implanted is not shown to keep the drawings simple.

After the oxygen implantation, the substrate 13 is heated. The temperature at which the substrate is heated is sufficient to effectively anneal out the damage caused by the implant and also to react the implanted oxygen with the silicon to form silicon dioxide along the tapered side wall and bottom portion 21B of the trench 21 and to convert layer 17 to silicon dioxide (still shown as layer 17).

In one embodiment, the substrate is heated to a temperature from about 1150°–1300° C. The anneal is sufficiently long to ensure the desired formation of silicon oxide where the oxygen was implanted. Typically, the anneal lasts for several hours. Moreover, swelling occurs where the silicon and oxygen combine to form silicon oxide. This swelling tends to round off by filling sharp corners at the bottom of the trench 21 and make it easier for the silicon oxide that is subsequently to be deposited to fill the trench 21. Additionally, as the implanted silicon region at the bottom of the trench 21 is converted to oxide, its addition effectively deepens the isolation role of the trench 21.

Figure 5:
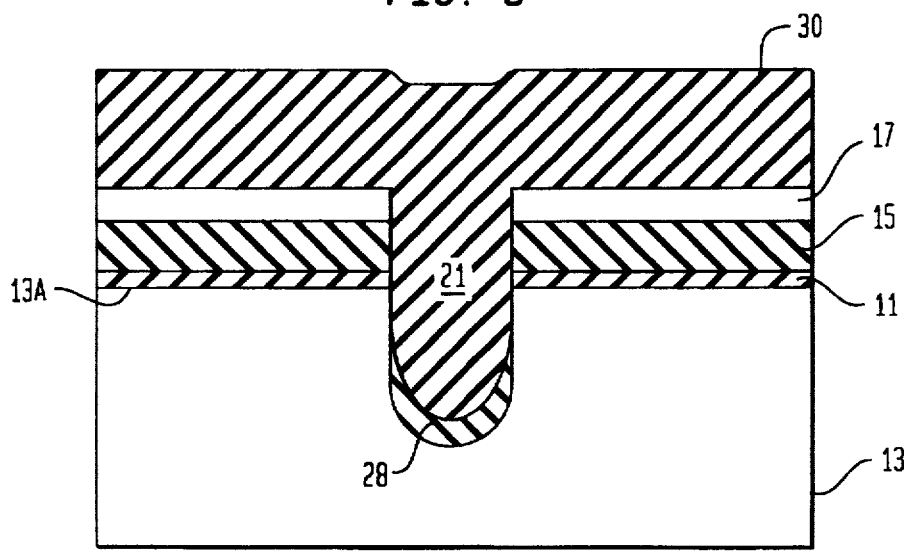

In FIG. 5 there is shown, as the region 28, the silicon oxide layer created at the bottom of the trench 21 by the heating step. It includes both a portion of the silicon chip 13 that was converted to oxide and a portion of the original trench 21 that was filled by the swelling. There is also shown a dielectric layer 30 deposited over the top surface of the chip. In one embodiment, the dielectric layer comprises silicon oxide. This layer 30 is deposited after first removing the silicon nitride layer 25 to permit this deposited layer to merge with layer 28. The bottom and the sidewalls of the trench may be oxidized as necessary. Advantageously, the thickness of this layer 30 is chosen to be enough to insure that its deposition results in filling the trench 21 so that layer 30 merges with silicon dioxide region 28. Various techniques for forming the dielectric layer are known and can be used for such purpose. For example, deposition of the dielectric layer includes TEOS or HDP.

Figure 6:
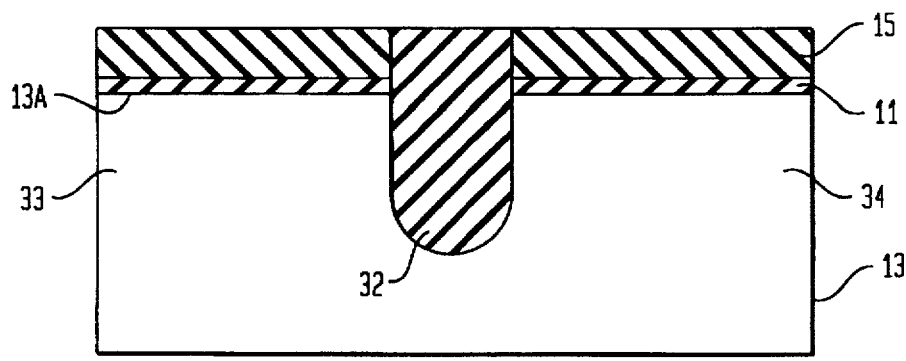

Next, the silicon oxide layer 30 is subjected to chemical mechanical polishing to planarize its top surface about to the level of the original PAD silicon nitride layer 15, which can serve as an etch stop, as is seen in FIG. 6. A portion 32 of the layer 30 remains to fill the trench 21. Any of known techniques can be used for this step.

After removal of the silicon oxide layer 30, there results a chip 13, as is shown in FIG. 6, whose top (active) surface includes a silicon oxide filled trench 32 that divides the upper portion of the chip into a plurality of electrically isolated regions 33 and 34, each of which can then be used to house one or more components of the desired integrated circuit. These components would be subsequently connected together, as desired, by one or more layers of conductive patterns (not shown) over the top surface of the chip 13 in known fashion. In some instances, it may prove desirable to provide connections to some of the components to a voltage source terminal, such as ground, by way of the back surface.

It can be appreciated that various changes can be made in the illustrative embodiment that has been described without departing from the spirit and scope of the invention. In particular, the specific dimensions mentioned are merely presently preferred and other dimensions should be feasible. Additionally, any suitable technique should be feasible for forming the trench with at least a tapered lower portion useful for the invention. Similarly, while the properties described for materials used for the various layers mentioned are believed important, other materials with similar properties may be feasible. Moreover, in some instances, it may be preferable to fill the oxygen-implanted trench with the deposited silicon oxide before the heating of the chip to react the implanted oxygen with silicon chip. This may sometimes prove a better way to minimize voids in the lower portion of the trench, after the processing is complete.

What is claimed is:

1. A process for fabricating semiconductor devices including the steps of forming an isolation trench comprising:

forming in a semiconductor substrate a trench;

implanting oxygen ions into the trench;

heating the substrate to form silicon oxide where the oxygen was implanted; and filling the trench with a dielectric layer.

* * * * *